United States Patent [19]
Tan et al.

[11] Patent Number: 5,962,080
[45] Date of Patent: *Oct. 5, 1999

[54] DEPOSITION OF INSULATING THIN FILM BY A PLURALITY OF ION BEAMS

[75] Inventors: Minshen Tan, Fremont; Swie-In Tan, San Jose, both of Calif.

[73] Assignee: Read-Rite Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/795,161

[22] Filed: Feb. 10, 1997

Related U.S. Application Data

[63] Continuation of application No. 08/423,227, Apr. 17, 1995, abandoned.

[51] Int. Cl.[6] .............................. C23C 14/08; C23C 14/00
[52] U.S. Cl. ..................... 427/529; 427/528; 427/595; 204/192.11
[58] Field of Search .................................. 427/529, 531, 427/561, 595, 528; 204/192.11, 298.23; 118/730, 727

[56] References Cited

U.S. PATENT DOCUMENTS

| | | | |
|---|---|---|---|
| 4,634,600 | 1/1987 | Shimizu et al. | 427/531 |
| 4,652,954 | 3/1987 | Church | 427/130 |
| 4,793,908 | 12/1988 | Scott et al. | 204/192.11 |
| 4,816,133 | 3/1989 | Barnett | 118/730 |
| 4,874,493 | 10/1989 | Pan | 204/192.11 |
| 4,886,681 | 12/1989 | Clabes et al. | 427/531 |
| 4,951,604 | 8/1990 | Temple et al. | 118/730 |
| 4,992,298 | 2/1991 | Deutchman | 427/529 |
| 5,074,246 | 12/1991 | Gailliard et al. | 118/730 |
| 5,089,104 | 2/1992 | Kanda et al. | 204/192.11 |
| 5,098,736 | 3/1992 | Fukuda | 427/529 |
| 5,240,583 | 8/1993 | Ahonen | 204/192.11 |
| 5,301,418 | 4/1994 | Dirne et al. | 29/603 |

OTHER PUBLICATIONS

Handbook of Ion Beam Processing Technology, J. Cuomo & S. Rossnagel, H R. Kaufman, pp. 186–191, pp. 366–372, published by Noyes Publication, 1989.

*Primary Examiner*—Marianne Padgett
*Attorney, Agent, or Firm*—Nathan N. Kallman

[57] ABSTRACT

A method of depositing insulating thin films on a substrate employs a target that is formed of material which includes a constituent element of the insulating thin film. An ion beam preferably of inert gas is then directed toward the target to disperse the target material. Simultaneously, a second ion beam which includes another constituent element of the insulating thin film is also directed toward the substrate. The material from the target and the element of the second ion beam react in proper stoichiometry and is deposited onto the substrate as the insulating thin film.

5 Claims, 2 Drawing Sheets

DEPOSITION OF INSULATING THIN FILM BY A PLURALITY OF ION BEAMS

This application is a continuation of application Ser. No. 08/423,227, filed Apr. 17, 1995, now abandoned.

FIELD OF THE INVENTION

This invention relates to magnetic recording head fabrication and in particular to methods of depositing insulating thin films on magnetic recording heads.

BACKGROUND OF THE INVENTION

Present day processing technology enables the fabrication of magnetic heads at a miniaturized scale. To achieve this end, circuit components are scaled down both in areal dimension and in height dimension with thinner interposing layers. However, there are certain thickness limits the interposing layers need to maintain. Beyond such limits, various reliability problems may arise. For example, in a magnetic head, the read-write gap is formed of an insulating layer spacing two magnetic layers. A thinner gap offers the benefit of allowing the magnetic head to process high density data signals. However, the thinner insulating layer forming the gap is more prone to pinholes, which may bridge the magnetic layers and render the magnetic head inoperable. For example, where an insulating layer separates two conducting layers, a thin insulating layer may be incapable of withstanding the electric fields emanating from the two conducting layers. Consequently, the insulating layer may experience a dielectric breakdown, which results in a disastrous failure. Accordingly, there is a need to provide high quality insulating films to meet the demands of the magnetic recording head industry.

Materials most commonly used as insulating layers in magnetic recording heads are alumina ($Al_2O_3$) and silicon dioxide ($SiO_2$). The quality of these insulating layers can be gauged by a number of parameters. A good insulating film is uniform in thickness over a large surface area, thereby allowing the overlying layers to assume good step coverage. In addition, the film should be free of pinholes, thereby preventing any magnetic or electrical shorts of the overlying and underlying layers. Furthermore, a good insulating film is capable of withstanding high electric breakdown voltage, and is resistant to certain chemical etchants.

Insulating films can either be thermally grown by oxidation or by deposition. For instance, $SiO_2$ can be grown out of a silicon substrate via the process of oxidation. However, when the substrate material is different from the insulating material, deposition methods are preferred. U.S. Pat. No. 5,256,266 to Blanchette et al. discloses a process for sputtering and depositing alumina that is crypto-crystalline and is useful as the insulating layer which forms the transducing gap of the head.

Thin film deposition may be accomplished by sputtering, chemical vapor deposition (CVD) or plasma enhanced CVE) (PECVD). One example of depositing insulating thin films by sputtering is described herein with reference to FIG. 1. A typical arrangement for depositing insulating thin films during magnetic head fabrication employs a sputterer 2 encased within a chamber 4. Fixed inside the chamber 4 are a target plate 6 and a substrate fixture 8. Secured atop the substrate fixture 8 are substrates 10 of the magnetic recording heads to be processed. The target plate 6 is normally formed of material to be deposited onto the substrate 10. For example, as shown in FIG. 1, the target plate 6 is made of alumina.

Prior to the deposition process, air is first pumped out of the chamber 4 in a direction signified by arrow 12 via outlet 14. After a satisfactory vacuum level inside chamber 4 is reached, an inert gas, such as argon (Ar), is then admitted into the chamber 4 in a direction designated by arrow 16 via an inlet 18. When the inert gas inside the chamber 4 reaches a sufficiently high pressure level, the sputterer 2 is then ready for operation.

The target 6 and the substrate fixture 8 are normally biased through a steep electric potential by the voltage source 20 in the range of 500 Volts to 1000 Volts. The inert gas atoms between the target 6 and the substrate fixture 8 are thereby ionized. In essence, the electrons of the inert gas atoms are attracted toward the substrate fixture 8 while the positively charged ions 22 move toward the target 6. In the process, target molecules 24 are dislodged and dispersed from the target 6 and deposited onto the substrate 10 as the insulating thin film. It should be noted that the above description is depicted at the molecular level. Actually, the gas ions 22 form a plasma 26 bombarding the target 6 constantly.

The sputtering method, as described above, has been widely used in the processing of electronic circuits. However, there are several drawbacks associated with this method. First, inert gas inside the chamber 4 must be at a relatively high pressure in order to sustain a plasma. Very often, at such high pressure level, impurities inside the inert gas can easily be deposited onto the substrate surfaces, resulting in deposited films with high pinhole counts. Equally as undesirable, both the target plate 6 and the substrate fixture 8 of the sputtering apparatus 2 are tied to high voltage potentials. The target plate 6 especially and the substrate fixture 8 are practically incapable of any mechanical motions. The main reason is that any relative motions between the target plate 6 and the substrate fixture 8 would disturb the sustained plasma 26 and negatively affect the sputtering process. However, with the substrate 10 stationary relative to the target 6, the target molecules 24 may not be uniformly deposited onto the surfaces of the substrate 10. Consequently, the insulating films may be deposited with uneven thickness.

For electronic circuits having large geometrical sizes, insulating thin films fabricated from the sputtering method may be capable of fulfilling their intended functions. However, as circuits scale down in physical dimensions, conventionally deposited insulating films with the aforementioned shortfalls could affect the final production yield and reliability.

SUMMARY OF THE INVENTION

An object of the invention to provide a method of depositing insulating films with uniformity in thickness over a large surface area, that are less susceptible to pinholes, and are capable of withstanding high electric fields and are more resistant to certain chemical etchants.

Another object is to provide thin films with more uniform physical and chemical properties.

In the preferred method, a target formed of material which includes a first constituent element of the insulating thin film is mounted inside an enclosure. At an appropriate vacuum level, a first ion beam preferably of inert gas is directed toward the target to disperse the target material. Simultaneously, a second ion beam which includes a second constituent element of the insulating thin film is also directed toward the substrate. The material dispersed from the target and the second constituent element of the second ion beam react in proper stoichiometry and are deposited onto the substrate as, the insulating thin film. The microscopic structure of the resultant films are found to be crystalline, so that the deposited films have better physical, electrical and chemical characteristics, and which can be used for the insulating transducing gaps in magnetic recording heads.

These and other advantages, features, and objects of the present invention will be apparent to those skilled in the art from the following detailed description, taken together with the accompanying drawings, in which like reference numerals refer to like parts.

DETAILED DESCRIPTION OF THE INVENTION

Figure 2:
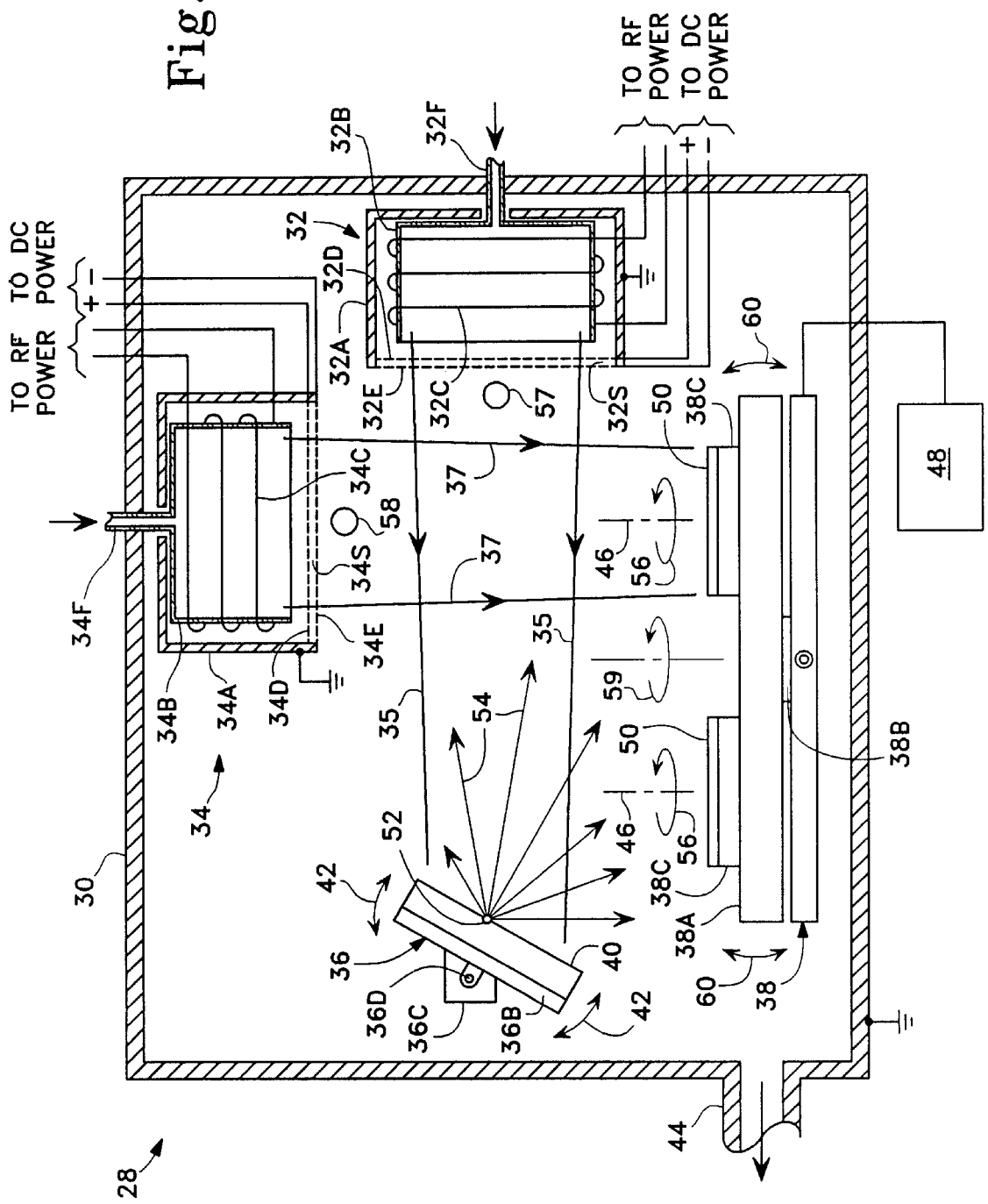
FIG. 2 is a schematic drawing of a sputtering system, which is employed to implement the method of the present invention.

With reference to FIG. 2, a deposition apparatus 28 which comprises a chamber 30 that houses a primary ion beam gun 32, a secondary ion beam gun 34, a target holder 36 and a substrate support 38. The primary and the secondary ion beam guns 32 and 34 are directed toward the target holder 36 and the substrate support 38, respectively. The substrate support 38 includes a turntable 38A revolvable around a shaft 38B. There are a plurality of substrate mounts 38C disposed atop the turntable 38A. The substrate mounts 38C are also implemented to be rotatable about axes 46 on the top of turntable 38A. The mechanical motions of the turntable 38A and the mounts 38C are controlled by an control circuit board 48 external to the chamber 30. An air outlet 44 is also built in as part of the chamber 30.

Ion guns 32 and 34 are substantially similar in structure. Only the primary ion gun 32 is described herein. The ion gun 32 includes a ground shroud 32A which in turn encompasses a quartz discharge chamber 32B. Wound around the quartz discharge chamber 32B is a RF (Radio Frequency) coil 32C. A screen grid 32D and an accelerator grid 32E, which are spaced from each other, are disposed in front of the opening of the ground shroud 32A. A pair of neutralizers 57 and 58 are also positioned adjacent to and in front of the ions guns 32 and 34, respectively.

The target holder 36 comprises a target mount 36B upon which a target 40 is releasably attached to. An oscillating drive 36C is engaged with the target mount 36B through a pivotal shaft 36D. The drive 36C is capable of oscillating the target mount 36B as shown by the bidirectional arrows 42.

Prior to the deposition process, a target 40 with the target material for deposition is first mounted onto the target mount 36B. Substrates 50 to be deposited with the target material are then positioned onto the rotatable mounts 38C. Thereafter, the chamber 30 is pumped to a vacuum level through the outlet 44. At a sufficiently low pressure level, the deposition process is ready to be initiated.

There are two basic processes within the scope of the invention whereby insulating films can be deposited onto the substrates 50. In the first process, the chosen target 40 comprises material substantially the same as the films to be deposited. For example, in the deposition of alumina films, the target 40 can be an alumina block. On the other hand, in the second process, the selected target 40 includes material content substantially different from the material content of films to be deposited. In the deposition of alumina films, the chosen target 40 can be an aluminum (Al) metal block. In any event, the target 40 comprises a constituent element of the insulating film to be deposited. In the two examples described above, the film to be deposited includes $Al_2O_3$, and Al in either target is a constituent element of $Al_2O_3$.

To start the first process, argon (Ar) gas of ultra high purity is first admitted into the inlet 32F of the discharge chamber 32B. In a similar manner, a mixture of Ar and $O_2$ gases are released into chamber 34B. The coils 32C and 34C are then energized with the required RF power. Electrons emitted from neutralizers 57 and 58 ignite the Ar atoms inside chambers 32B, and the Ar atoms and $O_2$ molecules inside the chamber 34B, respectively. As a consequence, plasmas of the respective ions are formed in each of the chambers 32B and 34B. Screen and accelerator grids 32D and 32E in primary gun 32, and grids 34D and 34E in secondary gun 34 are then adjusted to define the proper beam energy levels. Essentially, the positively powered grids 32D and 34D, form with the negatively powered grids 32E and 34E, steep potential fields within the narrowly confined grid spaces 32S and 34S, respectively. The ions inside the discharge chamber are attracted to and accelerated toward the steep potential fields, and emit beyond the grids 32E and 34E as ion beams 35 and 37, respectively.

In should be noted that by generating plasmas in separate discharge chambers 32B and 34B, gaseous pressure inside the overall chamber 30 can be set at a level much lower than that required by the sputtering method. The consequential benefit is that with the cleaner surrounding environment, the chance of contamination is accordingly reduced resulting in deposited films with less physical defects.

As shown in FIG. 2, the primary gun 32 directs a first ion beam 35 toward the target 40. The ion beam 35 in turn disperses the material from the target 40. In this specification and in the appended claims, the phrase "disperse material" and its equivalent thereof, when used in conjunction with a target, is construed as to dislodge and to disassociate the material from the target at the atomic or molecular level. For example, in this case, the Ar ions disperse the material from the target 40 in the form of molecular alumina particles 52 traveling in somewhat random directions 54. The target particles 52, carrying the transferred momentums of the ions from the ion beam 35, travel and accumulate onto the surfaces of the substrate 50 as the deposited insulating film.

The secondary gun 34 also aims a second ion beam 37 toward the substrates 50 during the deposition process. As mentioned before, the ion beam 37 is composed of $O_2$ and Ar ions. The purpose of bombarding the substrate 50 with the ion beam 37 is twofold. The moderate bombardment of the assist beam helps to improve film adhesion and thereby forms a thin film with better density than without the assist beam. Also, the oxygen in the beam helps to maintain proper stoichiometry in the first process mode. In the second process mode, oxygen becomes the major ingredient of the film to be formed at the substrate 50. The higher powered assist beam containing oxygen irons reacts with aluminum from the target 40 directly at the surface of the substrate 50. This greatly enhances the formation of crystalline alumina.

Figure 1:
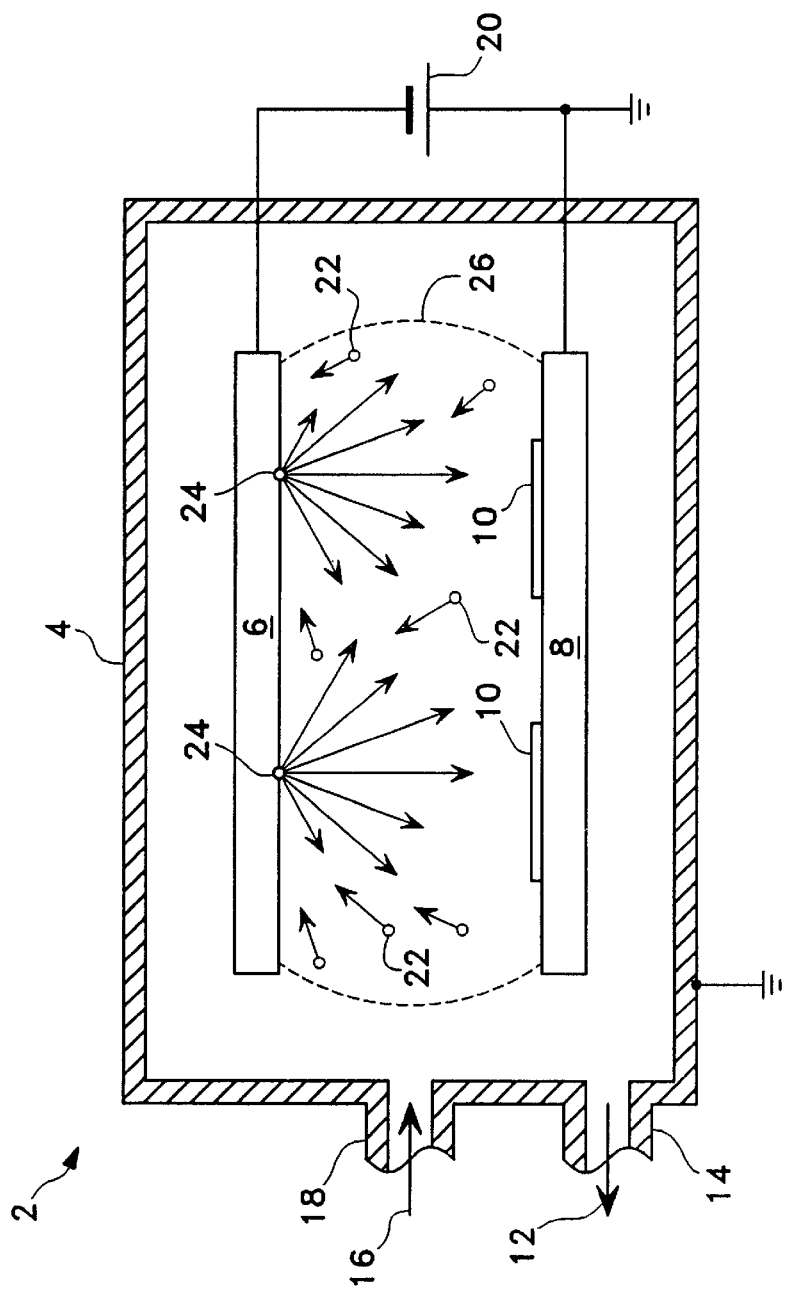
FIG. 1 is a schematic drawing of a prior art sputtering system for depositing insulating films.

It also should be noted that in contrast to the prior art sputtering mechanism illustrated in FIG. 1, there are no high voltage wirings or contacts affixed to either the target 36 or the substrate support 38. The target holder 36 can be designed with an oscillating motion signified by bidirectional arrow 42. In addition, the turntable 38A can be operated with rotating motions signified by arrow 59. Likewise, the substrate mounts 38C can be designed with rotatable motion signified by arrow 56 atop the turntable 38A. Optionally, the entire substrate support 38 can be operated in an oscillating motion as represented by bidirectional arrow 60. The motions 42, 56, 59 and 60 are all designed to achieve uniform film thickness on the substrate 50.

In the first process, the deposition rate is about 90 Å/minute. During deposition, the primary gun 32 may be operated at a power level substantially higher than that of the secondary gun 34. A typical set of operating parameters is with the beam current of the primary ion beam 35 set at approximately 650 mA (milliamperes) and the current of the secondary beam 37 at about 200 mA. The grid voltages applied at primary accelerating grid 32E and the secondary accelerating grid 34E can be fixed at respectively 1500 Volts and 300 Volts. The atmospheric pressure inside the chamber 30 can be maintained between $2\times10^{-4}$ Torrs to $3\times10^{-4}$ Torrs.

As a demonstration, insulating $Al_2O_3$ films of approximately 2000 Å are deposited via the first process under the above stated conditions and via the sputtering method. During sputtering, the target-to-substrate bias voltage is set from a few hundred to 1000 Volts under a gas pressure in the order of $10^{-2}$ Torr. The resultant films from both methods are compared and analyzed. The measured parameters are tabulated as follows:

|  | Deposition Process | Sputtering |
| --- | --- | --- |
| Mechanical Stress ($\times 10^{10}$ dyne/cm$^2$) | 0.15 to 0.25 | 1 |
| Breakdown Voltage ($\times 10^6$ V/cm) | 2 to 3 | 1.4 to 2 |
| Etch Rate (in positive resist developer) | 40 Å/min. | 70 Å/min. |

From the above table, the mechanical stress is defined as the tension force existent between the substrate and the deposited film at room temperature. As shown, films deposited with the deposition method of the present invention are significantly less stressed in comparison. The breakdown voltage is defined as the voltage applied to the major surfaces of the film just prior to dielectric breakdown. The result shows that films fabricated from the preferred method of the invention are approximately 50% better in performance. The films deposited from the method of the invention also show more resistance to positive photoresist developers, such as AZ400K manufactured by Hoechst Celanese Corp., Sunnyvale, Calif. Photoresist developers are etchants used to define patterns of other layers during processing. With this inventive process, the deposited films are more uniformly distributed over a larger surface area. Also better step coverage of the overlying layers is achieved.

The operational details of the first and second process are substantially similar. For the sake of brevity, only the differences are herein highlighted. In the second process, as mentioned before, the selected target 40 comprises material content substantially different from that of films to be deposited. During deposition, the material dispersed from the target 40 by the primary ion beam 35 reacts with the material from the secondary ion beam 37, in which oxygen ions are a majority, to be deposited onto the substrates 50 as the insulating thin film. There is a higher degree of activity of chemical reaction during deposition in the second deposition process than with the first process.

During deposition, using the second process, the secondary gun 34 is operated at a power level comparable to that of the primary gun 32. For example, the primary beam 35 can be set at 400 mA (milliamperes) and the secondary ion beam 37 can be set at approximately 300 mA. The grid voltages applied at primary accelerating grid 32E and the secondary accelerating grid 34E can be fixed respectively at 650 Volts and 550 Volts. Moreover, the discharge chamber is proportionally mixed with gas higher in oxygen content. The gaseous pressure inside the chamber 30 can be maintained at between $2\times10^{-4}$ Torrs to $3\times10^{-4}$ Torrs. The deposition rate under the above operating conditions is approximately 15 Å/min. As the assist ion beam energy and current density in the second mode are significantly higher than in the first process mode, the localized reaction at the substrate surface and the mobility of the impinging atoms are greatly enhanced. Insulating films thus deposited are crystalline, as demonstrated by transmission electronmicroscopy (TEM) in both plane view and cross-section view. The refractive index is 1.75 measured at 623.8 nanometers. Such films have very high resistance to etching. It etches less than 30 Angstroms (Å) only in a 10% hydrogen fluoride (HF) solution.

Other variations are possible within the scope of the invention. For example, in applications where film uniformity is not of paramount importance, the target holder 36 and the substrate fixture 38 can be designed to be stationary. The materials used need not be restricted to these described above. For example, films to be deposited can be $SiO_2$ and the target 40 can be a silicon (Si) block. As a further alternative, the film deposited can be silicon nitride ($Si_3N_4$) and the selected target 40 can be Si or $Si_3N_4$ depending on whether the first or second process is chosen.

What is claimed is:

1. A method of forming within a vacuum chamber a plurality of insulating thin films of alumina for incorporating as read-write gap layers into magnetic recording heads formed on substrates comprising:

providing a substrate support, said substrate support including a turntable;

providing a plurality of substrate mounts supported on said turntable;

providing a target formed of a material which includes a first component of the insulating thin film;

providing a target holder for supporting said target;

providing a first discharge chamber within said vacuum chamber into which Argon gas is directed through a first inlet;

providing a second discharge chamber within said vacuum chamber into which a mixture of Argon and oxygen gases are directed through a second inlet;

igniting said gases concurrently in said first and second discharge chambers by RF power for generating plasmas within said vacuum chamber;

directing a first ion beam toward said target for dispersing material from said target;

directing a second assist ion beam toward said substrates, said second assist ion beam including a second component of the insulating thin films wherein the material dispersed from said target reacts with said second component of said second assist ion beam and deposits onto the substrates as insulating thin films;

while directing said first ion beam and said second assist ion beam, simultaneously rotating said substrate mounts continuously about substantially parallel spaced axes and independently rotating said turntable continuously about a shaft and oscillating said target holder continuously and bidirectionally and oscillating said substrate support continuously and bidirectionally;

whereby said insulating thin films of said alumina are deposited uniformly on said substrates of said magnetic recording heads with minimal pinholes.

2. The method of forming an insulating thin films as set forth in claim 1 wherein said target is formed of aluminum.

3. A method of forming said insulating thin films of alumina on said substrates as in claim 1 wherein said first component is aluminum and said first ion beam is operated at about 400 milliamperes and said second assist ion beam is operated at about 300 milliamperes, within said vacuum chamber under a pressure between $2 \times 10^{-4}$ and $3 \times 10^{-4}$ Torr, whereby said insulating thin films are deposited at a rate of about 90 Angstroms per minute.

4. A method of forming said insulating thin films of alumina on said substrates as in claim 1 wherein said first component is alumina and said first ion beam is operated at about 600 milliamperes and said second assist ion beam is operated at about 200 milliamperes within said vacuum chamber under a pressure between $2 \times 10^{-4}$ and $3 \times 10^{-4}$ Torr, whereby said insulating thin films are deposited at a rate of about 15 Angstroms per minute.

5. The method of forming insulating thin films as set forth in claim 1 wherein said target comprises alumina.

* * * * *